United States Patent
Yan et al.

(10) Patent No.: US 7,163,839 B2
(45) Date of Patent: Jan. 16, 2007

(54) MULTI-CHIP MODULE AND METHOD OF MANUFACTURE

(75) Inventors: John Yan, Fremont, CA (US); Yong Du, Cupertino, CA (US); Bruce E. Symons, Pleasanton, CA (US)

(73) Assignee: Spansion LLC, Sunnyvale, CA (US)

(*) Notice: Subject to any disclaimer, the term of this patent is extended or adjusted under 35 U.S.C. 154(b) by 0 days.

(21) Appl. No.: 11/116,571

(22) Filed: Apr. 27, 2005

(65) Prior Publication Data

US 2006/0246704 A1 Nov. 2, 2006

(51) Int. Cl.
*H01L 21/44* (2006.01)
(52) U.S. Cl. .............................. 438/106; 257/E29.132
(58) Field of Classification Search ............... 438/135, 438/142, 145, 149, 151, 157, 176, 197, 199, 438/206–207, 212, 229, 231–234, 200–203, 438/5–7, 10–11, 14, 16–18, 22–24, 29, 31, 438/34–36, 127–130, 106–114, 118, 121–123, 438/128–129
See application file for complete search history.

(56) References Cited

U.S. PATENT DOCUMENTS

| | | | |
|---|---|---|---|
| 5,291,061 A | 3/1994 | Ball | |
| 5,323,060 A | 6/1994 | Fogal et al. | |
| 6,337,225 B1 | 1/2002 | Foong et al. | |
| 6,680,212 B1* | 1/2004 | Degani et al. | 438/14 |
| 6,710,455 B1* | 3/2004 | Goller et al. | 257/777 |
| 6,730,543 B1* | 5/2004 | Akram | 438/109 |
| 7,005,325 B1* | 2/2006 | Chow et al. | 438/123 |
| 7,064,006 B1* | 6/2006 | Akram | 438/106 |
| 2002/0045290 A1* | 4/2002 | Ball | 438/106 |
| 2002/0151103 A1* | 10/2002 | Nakamura et al. | 438/106 |
| 2003/0232461 A1* | 12/2003 | Bolken et al. | 438/106 |
| 2005/0012196 A1* | 1/2005 | Akram | 257/686 |
| 2005/0148113 A1* | 7/2005 | Karnezos | 438/109 |

* cited by examiner

*Primary Examiner*—Michael Lebentritt
*Assistant Examiner*—Andre' Stevenson
(74) *Attorney, Agent, or Firm*—Raj Jaipershad; Rennie Wm. Dover

(57) ABSTRACT

A multi-chip module and a method for manufacturing the multi-chip module. A first semiconductor chip is mounted to a support substrate and a second semiconductor chip is mounted to the first semiconductor chip. The second semiconductor chip has a smaller dimension than the first semiconductor chip. A spacer is coupled to the second semiconductor chip. Bonding pads on the first and second semiconductor chips are wirebonded to bonding pads on the support substrate. A third semiconductor chip is mounted to the spacer and bonding pads on the third semiconductor chip are wirebonded to bonding pads on the support substrate.

16 Claims, 5 Drawing Sheets

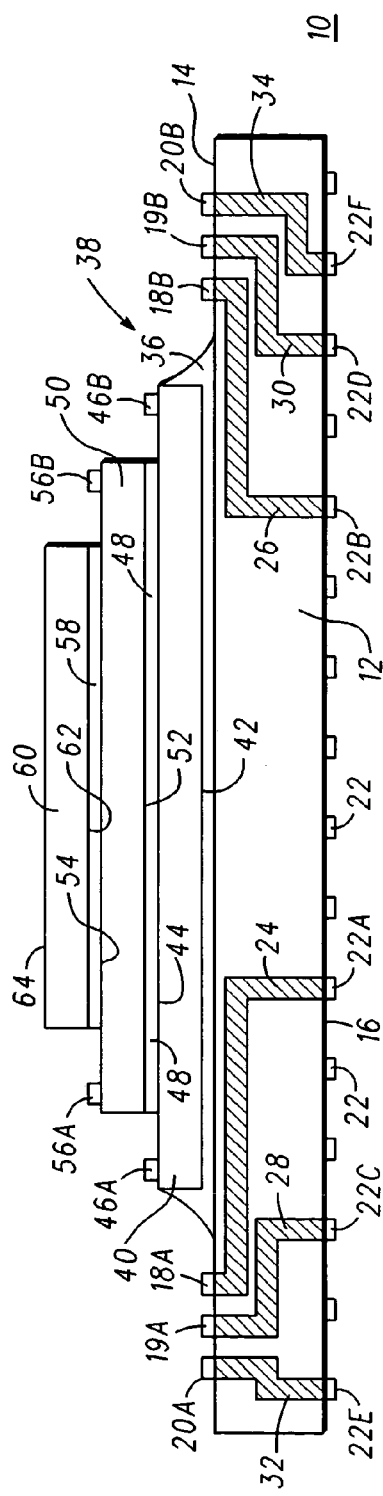
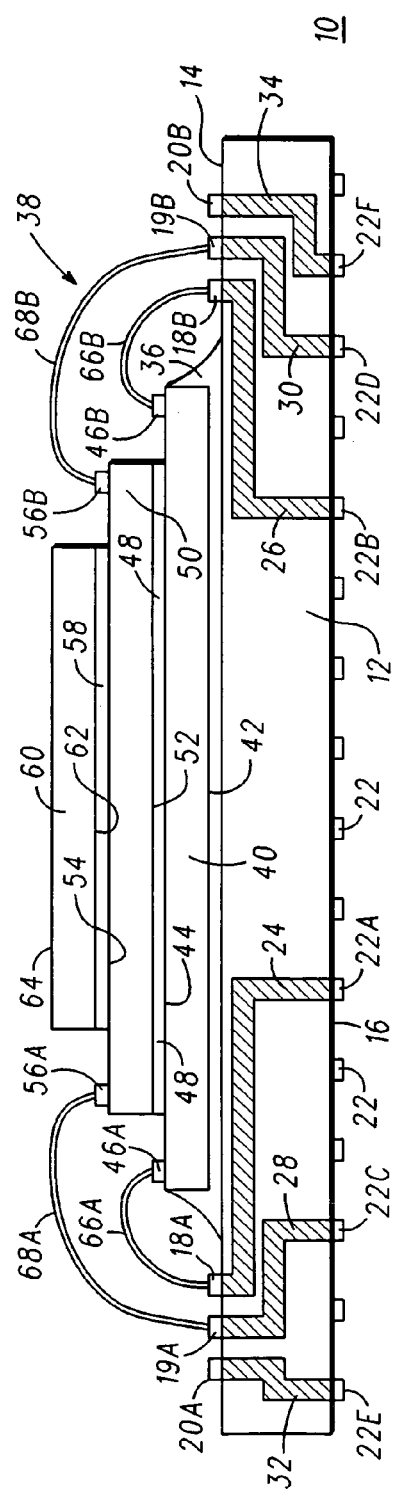

MULTI-CHIP MODULE AND METHOD OF MANUFACTURE

FIELD OF THE INVENTION

The present invention relates, in general, to semiconductor components and, more particularly, to semiconductor components comprising multi-chip modules.

BACKGROUND OF THE INVENTION

The desire for faster, cheaper, and more efficient semiconductor components has motivated semiconductor component manufacturers to shrink the sizes of the devices fabricated in a semiconductor chip and place multiple semiconductor chips in a single package typically referred to as a multi-chip module. The semiconductor chips in a multi-chip module can be placed in either a horizontal orientation, i.e., beside each other, or a vertical orientation, i.e., vertically stacked on top of each other. In a conventional vertically stacked multi-chip module, a first semiconductor chip is attached to a circuit board by adhesive bonding followed by wirebonding bonding pads located on the semiconductor chip to corresponding bonding pads located on the circuit board. A first spacer is formed on or attached to the first semiconductor chip. Then bonding pads located on the first semiconductor chip are wirebonded to corresponding bonding pads located on the circuit board. A second semiconductor chip, which is smaller than the first semiconductor chip, is bonded to the first spacer and a second spacer is formed on or attached to the second semiconductor chip. Bonding pads located on the second semiconductor chip are wirebonded to corresponding bonding pads located on the circuit board. A third semiconductor chip, which is smaller than the first and second semiconductor chips, is bonded to the second spacer. Bonding pads located on the third semiconductor chip are wirebonded to corresponding bonding pads located on the support substrate. The multi-chip module may include additional spacers interleaved with semiconductor chips.

This type of package is expensive to manufacture because of the number of processing steps and the cost of package elements such as spacers. Further, as additional semiconductor chips and spacers are included the height of the multi-chip module increases, which increases the aspect ratio of the multi-chip module, i.e., the ratio of the height to length of the multi-chip module. Multi-chip modules having high aspect ratios increase the complexity of circuit board design in which they are incorporated.

Accordingly, it would be advantageous to have a low aspect ratio multi-chip module and a method for manufacturing the low aspect ratio multi-chip module. It would be of further advantage for the method and structure to be cost efficient and suitable for integration with a variety of multi-chip module processes.

SUMMARY OF THE INVENTION

The present invention satisfies the foregoing need by providing a multi-chip module and a method for manufacturing the multi-chip module. In accordance with one embodiment, the present invention includes a method for manufacturing a multi-chip module comprising providing a support substrate having first and second major surfaces, wherein the support substrate has a chip receiving area and a plurality of bonding pads disposed on the first major surface. A penultimate semiconductor chip having a plurality of bonding pads is coupled to the chip receiving area. At least one bonding pad of the plurality of bonding pads on the penultimate semiconductor chip is coupled to a first bonding pad of the plurality of bonding pads on the first major surface. A spacer is coupled to a portion of the first semiconductor chip. An ultimate semiconductor chip is coupled to the spacer after coupling the at least one bonding pad of the plurality of bonding pads of the penultimate semiconductor chip to the at least one bonding pad of the plurality of bonding pads on the first major surface. The ultimate semiconductor chip is larger than the penultimate semiconductor chip and has a plurality of bonding pads. At least one bonding pad of the ultimate semiconductor chip is coupled to a second bonding pad of the plurality of bonding pads on the first major surface.

In accordance with another embodiment, the present invention includes a method for manufacturing a multi-chip module comprising providing a support substrate having first and second major surfaces, wherein the support substrate has a chip receiving area and a plurality of bonding pads. A first semiconductor chip having a plurality of bonding pads is coupled to the chip receiving area. A second semiconductor chip having a plurality of bonding pads is coupled to the first semiconductor chip. A first bonding pad of the plurality of bonding pads on the first semiconductor chip is coupled to a first bonding pad of the plurality of bonding pads on the support substrate. A first bonding pad of the plurality of bonding pads on the second semiconductor chip is coupled to a second bonding pad of the plurality of bonding pads on the support substrate. A third semiconductor chip having a plurality of bonding pads is coupled to the second semiconductor chip, wherein the third semiconductor chip is larger than the second semiconductor chip. A first bonding pad of the plurality of bonding pads on the third semiconductor chip is coupled to a third bonding pad of the plurality of bonding pads on the support substrate.

In accordance with yet another embodiment, the present invention includes a multi-chip module comprising a support substrate having a chip receiving area and a plurality of bonding pads. A first semiconductor chip having a first dimension and a plurality of bonding pads is mounted to the chip receiving area. A penultimate semiconductor chip having a second dimension and a plurality of bonding pads is coupled to the first semiconductor chip, wherein the second dimension is less than the first dimension. A spacer is coupled to the first semiconductor chip. An ultimate semiconductor chip having a plurality of bonding pads and a third dimension is coupled to the spacer, wherein the third dimension is greater than the second dimension.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is a cross-sectional side view of a multi-chip module at an intermediate stage of manufacture in accordance with an embodiment of the present invention;

FIG. 2 is a cross-sectional side view of the multi-chip module of FIG. 1 at a later stage of manufacture and taken along section line 2—2 of FIG. 3;

DETAILED DESCRIPTION

Figure 3:
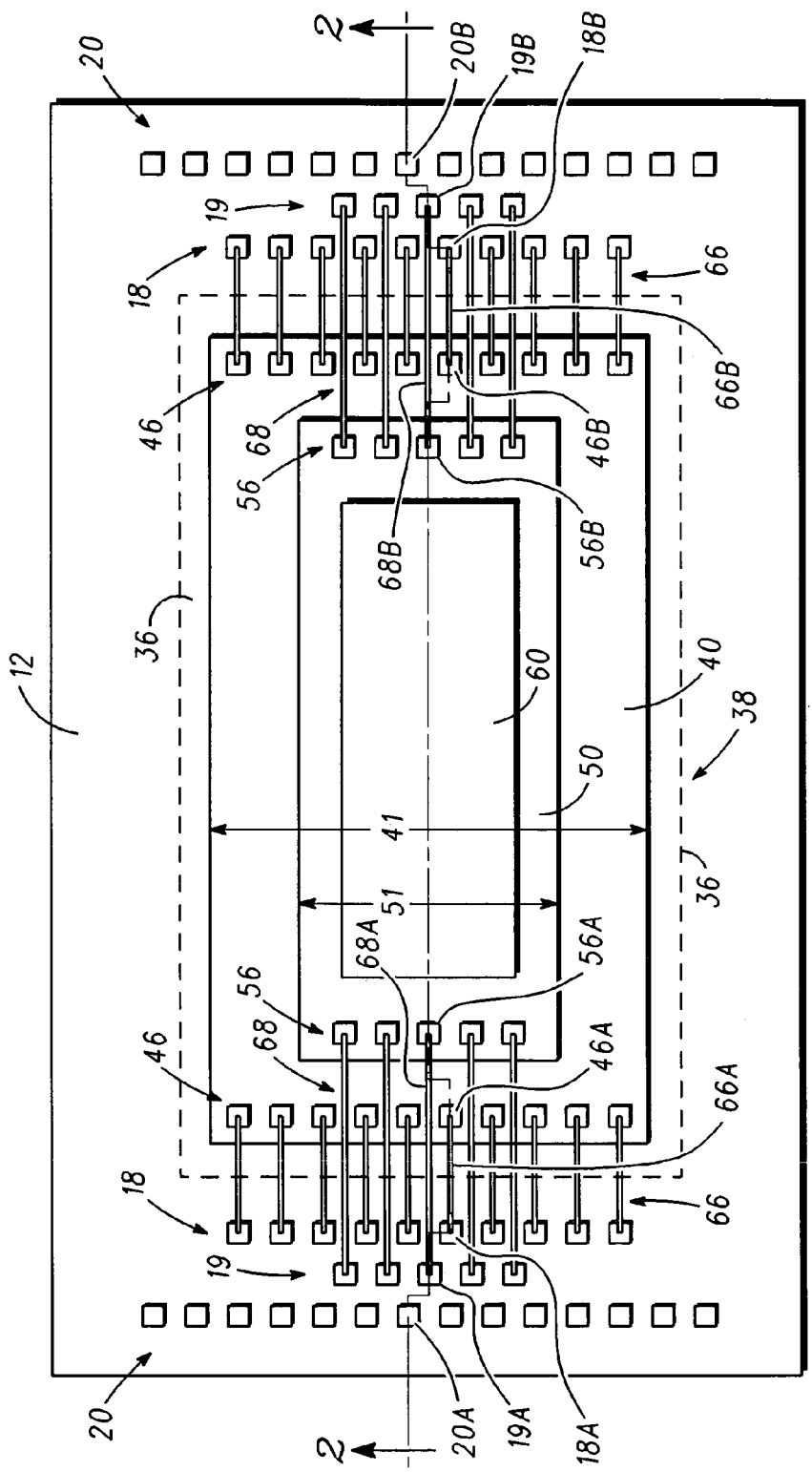
FIG. 3 is a top view of the multi-chip module of FIG. 2.

Generally, the present invention provides a multi-chip module and a method for manufacturing the multi-chip module, wherein the semiconductor chips of the multi-chip module are vertically stacked. Preferably, the lower semiconductor chips of a multi-chip module are bonded to each other in a spacer-less configuration, i.e., a spacer is not used to vertically separate the lower level semiconductor chips. In accordance with one embodiment, a spacer separates the two highest semiconductor chips. In other words, a spacer is positioned between the second-to-last semiconductor chip and the last semiconductor chip. The second-to-last semiconductor chip is referred to as the penultimate semiconductor chip and the last or highest semiconductor chip is referred to as the ultimate semiconductor chip.

FIG. 1 is cross-sectional side view of a portion of a multi-chip module 10 at an intermediate stage of manufacture in accordance with an embodiment of the present invention. What is shown in FIG. 1 is a Ball Grid Array (BGA) support structure 12 having top and bottom surfaces 14 and 16, respectively. BGA support substrate 12 is formed from a resin such as an epoxy resin, a polyimide resin, a triazine resin, or a phenolic resin. Preferably, the resin material of BGA support substrate 12 is bismaleimidetriazine (BT) resin. Other suitable materials for support substrate 12 include epoxy-glass composites, FR-4, ceramics, and the like. It should be understood that substrate 12 is not limited to being a BGA substrate but may also be a Pin Grid Array (PGA) substrate, a ceramic substrate, a printed circuit board, or the like. Bonding pads 18A and 18B, bonding pads 19A and 19B, and bonding pads 20A and 20B are formed on top surface 14. A plurality of bonding pads 22 are formed on bottom surface 16. Bonding pads 18A, 18B, 19A, 19B, 20A, and 20B are electrically connected to bonding pads 22A, 22B, 22C, 22D, 22E, and 22F, respectively, on bottom surface 16 through respective electrical interconnects 24, 26, 28, 30, 32, and 34 that extend through BGA support substrate 12. For the sake of clarity, only six interconnects are shown as extending through BGA support substrate 12 in FIG. 1. However, it should be understood that all or nearly all of the bonding pads on the top surface of a support substrate such as support substrate 12 are coupled to bonding pads on the bottom surface of the support substrate. It should be further understood that bonding pads 18A and 18B are two of a plurality of bonding pads 18 that are formed on top surface 14. Similarly, bonding pads 19A and 19B are two of a plurality of bonding pads 19 that are formed on top surface 14, and bonding pads 20A and 20B are two of a plurality of bonding pads 20 that are formed on top surface 14. (The pluralities of bonding pads 18, 19, and 20 are further illustrated and discussed with reference to in FIG. 3).

Still referring to FIG. 1, a die attach material 36 is dispensed on a semiconductor chip receiving area 38 and a semiconductor chip or die 40 is placed in die attach material 36. Semiconductor chip 40 has a bottom surface 42 and a top surface 44. Bottom surface 42 of a semiconductor chip 40 is placed in die attach material 36. Bonding pads 46A and 46B are disposed on top surface 44 adjacent opposing sides of semiconductor chip 40. Although only bonding pads 46A and 46B are shown, it should be understood that bonding pads 46A and 46B are part of plurality of bonding pads 46, which plurality of bonding pads is further shown and described with reference to FIG. 3. It should be further understood that the locations of bonding pads 46 are not limited to being adjacent opposing sides, but can be adjacent all sides of semiconductor chip 40 or fewer than all sides of semiconductor chip 40. Further, the number of bonding pads 46 is not a limitation of the present invention. The combination of substrate 12, semiconductor chip 40, and die attach material 36 is placed in a curing oven and die attach material 36 is cured. By way of example, die attach material 36 is cured by heating to a temperature ranging from about 100 degrees Celsius (° C.) to about 175° C. for a time ranging from about 5 minutes to about 60 minutes. Suitable die attach materials include silver filled epoxy, silica filled epoxy blend, an epoxy film filled with an organic material, and the like.

After curing die attach material 36, a die attach material 48 is disposed on a central portion of top surface 44 and a semiconductor chip or die 50 having top and bottom surfaces 54 and 52, respectively, is placed in die attach material 48. More particularly, bottom surface 52 of semiconductor chip 50 is placed in die attach material 48. Bonding pads 56A and 56B are disposed on top surface 54 adjacent opposing sides of semiconductor chip 50. Although only bonding pads 56A and 56B are shown, it should be understood that bonding pads 56A and 56B are part of plurality of bonding pads 56, which plurality of bonding pads is further shown and described with reference to FIG. 3. Like semiconductor chip 40, the locations of bonding pads 56 are not limited to being adjacent opposing sides of semiconductor chip 50, but can be adjacent all sides of semiconductor chip 50 or fewer than all sides of semiconductor chip 50. Also, the number of bonding pads 56 is not a limitation of the present invention. The combination of substrate 12, semiconductor chip 40, die attach material 36, semiconductor chip 50, and die attach material 48 is placed in a curing oven and die attach material 48 is cured. By way of example, die attach material 48 is cured by heating to a temperature ranging from about 100° C. to about 175° C. for a time ranging from about 5 minutes to about 60 minutes. Suitable die attach materials include silver filled epoxy, silica filled epoxy blend, an epoxy film filled with an organic material, and the like.

After curing die attach material 48, a die attach material 58 is disposed on a central portion of top surface 54 and a spacer 60 having top and bottom surfaces 64 and 62, respectively, is placed in die attach material 58. Spacer 60 may be a dielectric material or a semiconductor material such as, for example, silicon, or the like. Die attach material 58 is cured by heating it to a temperature ranging from about 100° C. to about 175° C. for a time ranging from about 5 minutes to about 60 minutes. Suitable die attach materials include silver filled epoxy, silica filled epoxy blend, an epoxy film filled with an organic material, and the like.

Referring now to FIG. 2, bonding pads 46 on semiconductor chip 40 are electrically connected to corresponding bonding pads 18 on BGA substrate 12 using, for example, a wirebonding process. What is shown in FIG. 2 is a bonding pad 46A coupled to a bonding pad 18A by an interconnect wire 66A and a bonding pad 46B coupled to a bonding pad 18B by an interconnect wire 66B. Similarly, bonding pads 56 on semiconductor chip 50 are electrically connected to corresponding bonding pads 19 on BGA substrate 12 using, for example, a wirebonding process. More particularly, a bonding pad 56A is coupled to a bonding pad 19A by an interconnect wire 68A and a bonding pad 56B is coupled to a bonding pad 19B by an interconnect wire 68B. Although only four interconnect wires are shown in FIG. 2, it should be understood that pluralities of interconnects 66 and 68 typically comprise more than two interconnect wires. (The pluralities of interconnect wires 66 and 68 are further illustrated and discussed with reference to in FIG. 3). It should be understood that the order of wirebonding is not a limitation of the present invention. For example, bonding pads 46 on semiconductor chip 40 can be electrically connected to corresponding bonding pads 18 on BGA substrate 12 before semiconductor chip 50 is coupled to semiconductor chip 40 through die attach material 58, rather than after semiconductor chip 50 is attached to semiconductor chip 40.

Referring now to FIG. 3, a top view of multi-chip module 10 is shown, wherein the top view illustrates the same stage of manufacture as that shown in FIG. 2. In other words, FIG. 2 is a cross-sectional side view taken along section line 2—2 of FIG. 3. FIG. 3 further illustrates the plurality of bonding pads 18, the plurality of bonding pads 19, the plurality of bonding pads 20, the plurality of bonding pads 46, the plurality of bonding pads 56, the plurality of wire interconnects 66, the plurality of wire interconnects 68, as well as the individual bonding pads 18A, 18B, 19A, 19B, 20A, and 20B and the individual interconnects 56A and 56B shown in FIG. 2. In addition, FIG. 3 illustrates spacer 60 and die attach material 36. Although semiconductor chips 40 and 50 and spacer 60 are shown as having rectangular shapes, their shapes are not limitations of the present invention. For example, semiconductor chips 40 and 50 and spacer 60 can have square shapes, round shapes, triangular shapes, pentagonal shapes, other polygonal shapes, or the like.

Semiconductor chips 40 and 50 have dimensions illustrated by arrows 41 and 51. In accordance with an embodiment of the present invention, dimensions 41 and 51 are the lengths of the sides of semiconductor chips 40 and 50 adjacent bonding pads 46 and 56, respectively. Dimension 51 is less than dimension 41.

Figure 4:
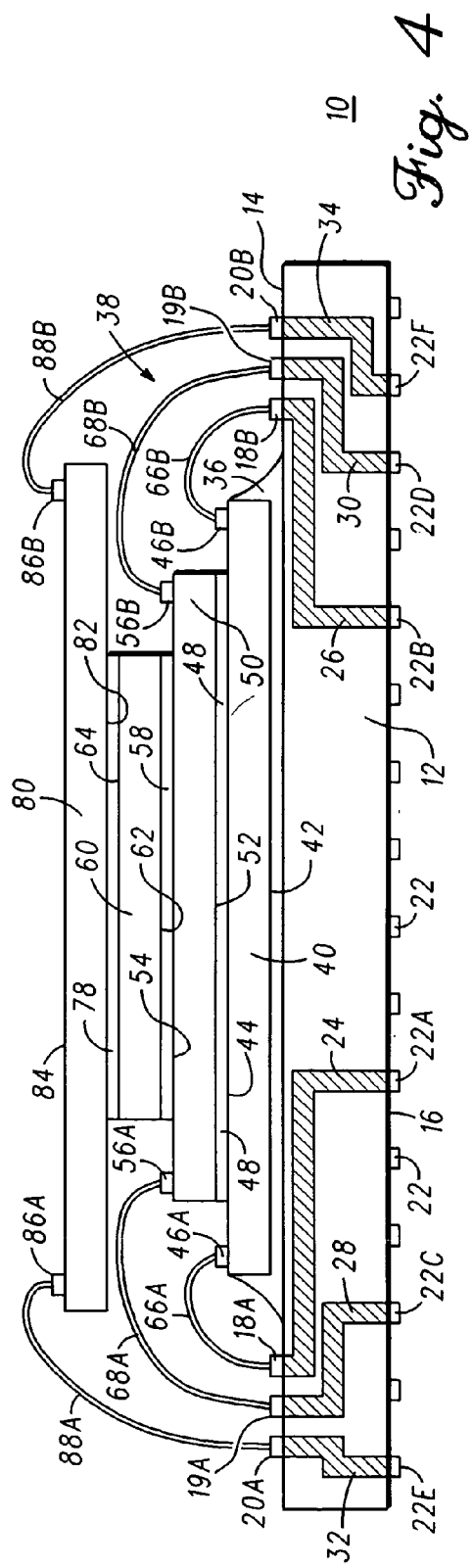
FIG. 4 is a cross-sectional side view of the multi-chip module of FIG. 2 at a later stage of manufacture and taken along section line 4—4 of FIG. 5.

Referring now to FIG. 4, a cross-sectional side view of multi-chip module 10 further along in manufacture is illustrated. A die attach material 78 is disposed on a central portion of top surface 64 of spacer 60 and a semiconductor chip or die 80, having a bottom surface 82 and a top surface 84, is placed in die attach material 78. More particularly, bottom surface 82 of semiconductor chip 80 is placed in die attach material 78. A plurality of bonding pads 86A and 86B is disposed on top surface 84 adjacent opposing sides of semiconductor chip 80. Although only bonding pads 86A and 86B are shown, it should be understood that bonding pads 86A and 86B are part of plurality of bonding pads 86, which plurality is further shown and described with reference to FIG. 5. Like semiconductor chips 40 and 50, the locations of bonding pads 86 are not limited to being adjacent opposing sides of semiconductor chip 80, but can be adjacent each side of semiconductor chip 80 or fewer than all sides of semiconductor chip 80. Also, the number of bonding pads 86 is not a limitation of the present invention. The combination of substrate 12, die attach material 36, semiconductor chip 40, die attach material 48, semiconductor chip 50, die attach material 58, spacer 60, die attach material 78, and semiconductor chip 80 is placed in a curing oven and die attach material 78 is cured. By way of example, die attach material 78 is cured by heating to a temperature ranging from about 100° C. to about 175° C. for a time ranging from about 5 minutes to about 60 minutes. Suitable die attach materials include silver filled epoxy, silica filled epoxy blend, an epoxy film filled with an organic material, and the like.

Figure 5:
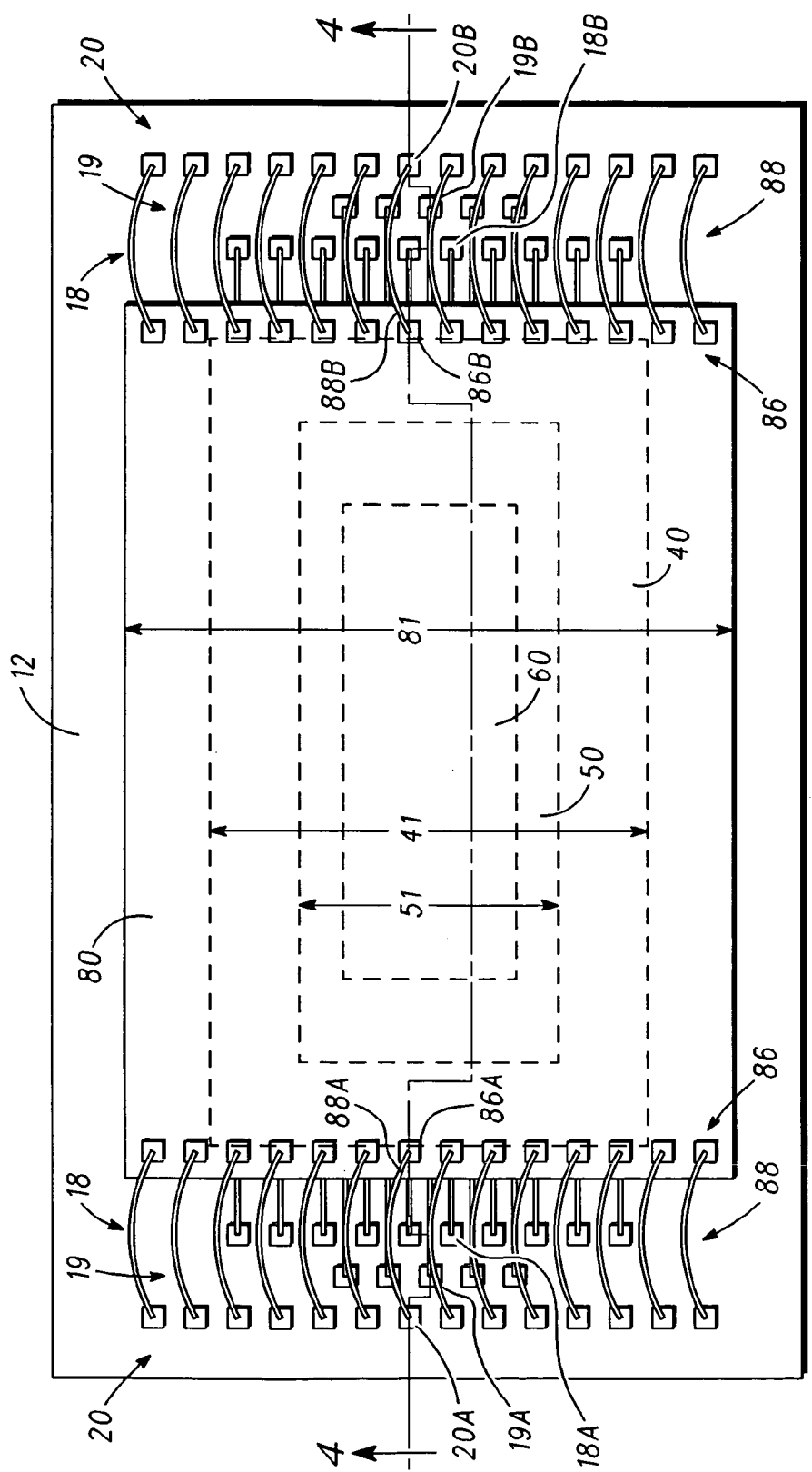
FIG. 5 is a top view of the multi-chip module of FIG. 4.

Briefly referring to FIG. 5, semiconductor chip 80 having a dimension illustrated by arrows 81 is shown. In accordance with an embodiment of the present invention, dimension 81 is the length of the sides of semiconductor chip 80 adjacent bonding pads 86. Dimension 81 is greater than dimension 51 and dimension 81 can be greater than dimension 41 or smaller than dimension 41. It should be understood that the sides defining dimensions 41, 51, and 81 are not limitations of the present invention.

Referring again to FIG. 4, because semiconductor chip 80 is the last or highest semiconductor chip in semiconductor component 10, it is referred to as the ultimate semiconductor chip. Semiconductor chip 50 on which semiconductor chip 80 is mounted is the next to last semiconductor chip and is referred to as the penultimate semiconductor chip. Although three semiconductor chips are shown and described, the number of semiconductor chips is not a limitation of the present invention. There may be more than three semiconductor chips stacked on semiconductor substrate 12. When there are more than three semiconductor chips stacked on semiconductor substrate 12, the last or highest chip is referred to as the ultimate semiconductor chip and the semiconductor chip immediately below the ultimate semiconductor chip, i.e., the second-to-last semiconductor chip, is referred to as the penultimate semiconductor chip.

Still referring to FIG. 4, bonding pads 86 on semiconductor chip 80 are electrically connected to corresponding bonding pads 20 on BGA substrate 12 using, for example, a wirebonding process. What is shown in FIG. 4 is bonding pad 86A coupled to bonding pad 20A by an interconnect wire 88A and bonding pad 86B coupled to bonding pad 20B by an interconnect wire 88B. Although only two interconnect wires are shown in FIG. 4, it should be understood that plurality of interconnects 88 typically comprises more than two interconnect wires. (The plurality of interconnect wires 88 is further illustrated and discussed with reference to in FIG. 5).

Referring again to FIG. 5, a top view of multi-chip module 10 is shown, wherein the top view illustrates the same stage of manufacture as that shown in FIG. 4. In other words, FIG. 4 is a cross-sectional side view taken along section line 4—4 of FIG. 5. FIG. 5 further illustrates the plurality of bonding pads 86, the plurality of bonding pads 20, and the plurality of wire interconnects 88 as well as the individual bonding pads 20A and 20B and the individual interconnects 88A and 88B. Although semiconductor chip 80 is shown as having a rectangular shape, this is not a limitation of the present invention. For example, semiconductor chip 80 can have a rectangular shape, a round shape, a triangular shape, a polygonal shape, or the like. It should noted that semiconductor chips 40 and 50 and spacer 60 are indicated by broken lines in FIG. 5.

Figure 6:
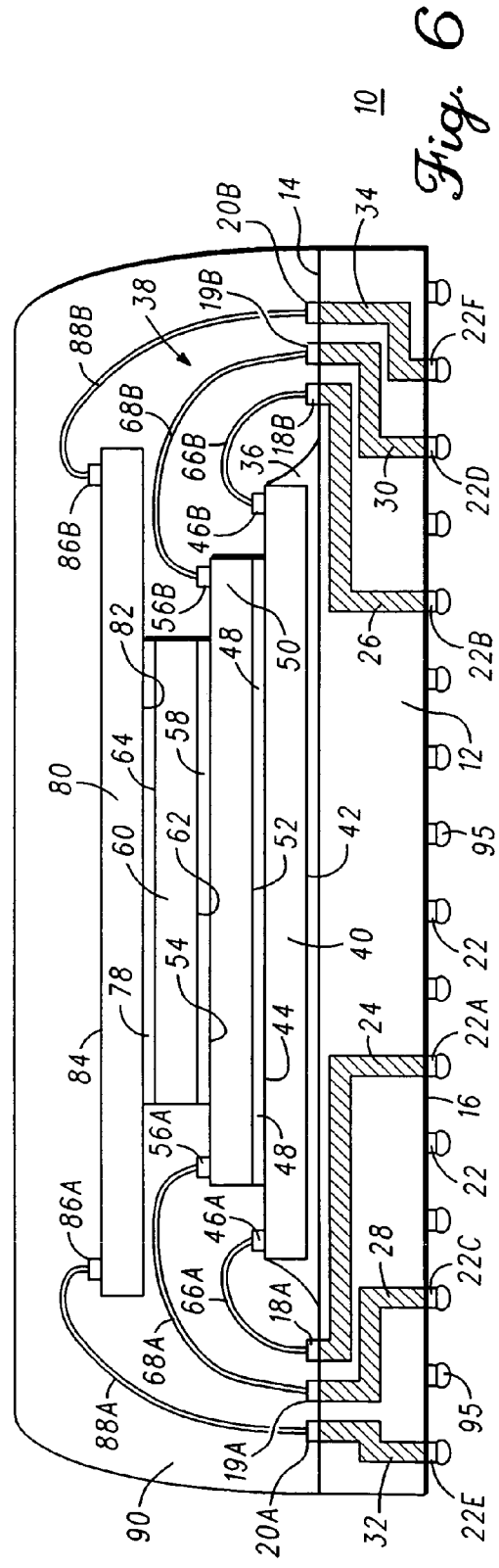
FIG. 6 is a cross-sectional side view of the multi-chip module of FIG. 4 at a later stage of manufacture.

Referring now to FIG. 6, a protective covering 90 is formed over semiconductor chip 80, interconnect wires 88A and 88B, and BGA support substrate 12. Protective covering 90 illustrated in FIG. 6 is formed over semiconductor chips 40, 50, and 80, and a portion of semiconductor substrate 12. By way of example, protective covering 90 is a mold compound. It should be understood that the type of protective covering is not limited to being a mold compound, but could be, for example, a lid or other suitable protective material.

Solder balls 95 are coupled to bonding pads 22.

Figure 7:
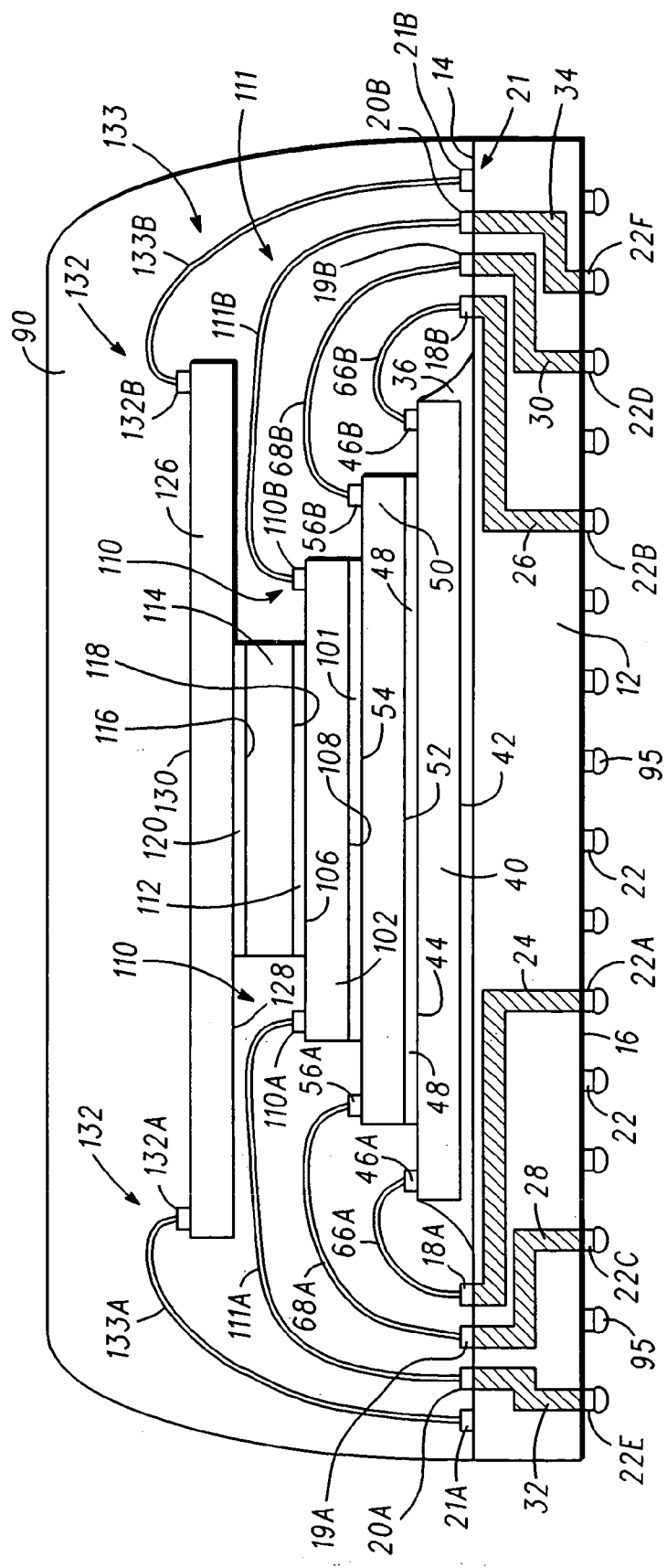
FIG. 7 is a cross-section side view of a multi-chip module in accordance with another embodiment of the present invention.

FIG. 7 is a cross-sectional side view of a multi-chip module 100 in accordance another embodiment of the present invention. What is shown in FIG. 7 is a support substrate 12 having semiconductor chips 40 and 50 stacked thereon. Mounting semiconductor chip 40 to support substrate 12 and semiconductor chip 50 to semiconductor chip 40 has been described with reference to FIG. 1. After curing die attach material 48, a die attach material 101 is disposed on a central portion of top surface 54 and a semiconductor chip or die 102 having top and bottom surfaces 106 and 108, respectively, is placed in die attach material 102. More particularly, bottom surface 108 of a semiconductor chip 102 is placed in die attach material 101. Bonding pads 110A and 110B are disposed on top surface 106 adjacent opposing sides of semiconductor chip 102. Although only bonding pads 110A and 110B are shown, it should be understood that bonding pads 110A and 110B are part of plurality of bonding pads 110. Like semiconductor chips 40 and 50, the locations of bonding pads 110 are not limited to being adjacent opposing sides of semiconductor chip 102, but can be adjacent each side of semiconductor chip 102 or fewer than all sides of semiconductor chip 102. Also, the number of bonding pads 110 is not a limitation of the present invention. The combination of substrate 12, semiconductor chip 40, die attach material 36, semiconductor chip 50, die attach material 101, and semiconductor chip 102 is placed in a curing oven and die attach material 101 is cured. Suitable die attach materials and curing processes have been described with reference to FIG. 1.

After curing die attach material 101, a bonding pad 110A is coupled to a bonding pad 20A by an interconnect wire 111A and a bonding pad 110B is coupled to bonding pad 20B by an interconnect wire 111B. Although only two interconnect wires 111A and 111B are shown in FIG. 7, it should be understood that typically there are more than two bonding pads 110 disposed on semiconductor chip 102 and more than two interconnect wires coupling bonding pads 110 to bonding pads on support structure 12. The plurality of interconnect wires is identified by reference number 111. Thus, there are more than two interconnect wires coupling bonding pads 110 on semiconductor chip 102 to corresponding bonding pads 20 on support substrate 12.

After wirebonding, a die attach material 112 is disposed on a central portion of top surface 106 and a spacer 114 having top and bottom surfaces 116 and 118, respectively, is placed in die attach material 112. Spacer 114 may be a dielectric material or a semiconductor material such as, for example, silicon, or the like. Suitable die attach materials and curing processes have been described with reference to FIG. 1.

A die attach material 120 is disposed on a central portion of top surface 116 of spacer 114 and a semiconductor chip or die 126, having a bottom surface 128 and a top surface 130, is placed in die attach material 120. More particularly, bottom surface 128 of semiconductor chip 126 is placed in die attach material 120. A plurality of bonding pads 132 is disposed on top surface 130 adjacent opposing sides of semiconductor chip 126. Like semiconductor chips 40, 50, and 102, the locations of bonding pads 132 are not limited to being adjacent opposing sides of semiconductor chip 126, but can be adjacent each side of semiconductor chip 126 or fewer than all sides of semiconductor chip 126. Also, the number of bonding pads 132 is not a limitation of the present invention. Although only bonding pads 132A and 132B are shown, it should be understood that bonding pads 132A and 132B are part of plurality of bonding pads 132. The combination of substrate 12, die attach material 36, semiconductor chip 40, die attach material 48, semiconductor chip 50, die attach material 101, semiconductor chip 102, die attach material 112, spacer 114, die attach material 120, and semiconductor chip 126 is placed in a curing oven and die attach material 120 is cured. Suitable die attach materials and curing processes have been described with reference to FIG. 1.

After curing die attach material 120, bonding pad 132A is coupled to a bonding pad 21A by an interconnect wire 133A and a bonding pad 132B is coupled to bonding pad 21B by an interconnect wire 133B. Although only two interconnect wires 133A and 133B are shown in FIG. 7, it should be understood that interconnect wires 133A and 133B are part of a plurality of interconnect wires 133. Typically there are more than two bonding pads 132 disposed on semiconductor chip 126 and more than two bonding pads 21 disposed on substrate 12. Thus, there are more than two interconnect wires 133 coupling bonding pads 132 on semiconductor chip 126 to corresponding bonding pads 21 on support substrate 12.

Semiconductor chip 126 has a dimension that is greater than the dimension of semiconductor chip 102. In accordance with an embodiment of the present invention, the dimension is the length of the sides of semiconductor chip 126 adjacent bonding pads 132. The dimension is greater than a corresponding dimension of semiconductor chip 102. The dimension can be greater than dimension 41 or smaller than dimension 41 described with reference to FIG. 3. It should be understood that the side defining the dimension is not a limitation of the present invention.

Because semiconductor chip 126 is the last or highest semiconductor chip in semiconductor component 100, it is referred to as the ultimate semiconductor chip. Semiconductor chip 102 on which semiconductor chip 126 is mounted is the next to last semiconductor chip and is referred to as the penultimate semiconductor chip. In this embodiment, semiconductor chip 50 is referred to as an interlevel semiconductor chip.

A protective covering 90 is formed over semiconductor chip 126, interconnect wires 133A and 133B, and BGA support substrate 12. Protective covering 90 illustrated in FIG. 7 is formed over semiconductor chips 40, 50, and 102, and a portion of semiconductor substrate 12. By way of example, protective covering 90 is a mold compound. It should be understood that the type of protective covering is not limited to being a mold compound, but could be, for example a lid or other suitable protective material.

Solder balls 95 are coupled to bonding pads 22.

By now it should be appreciated that a multi-chip module having vertically stacked semiconductor chips and a method for manufacturing the multi-chip module have been provided. An advantage of a multi-chip module in accordance with the present invention is that it reduces the number of spacers between semiconductor chips thereby lowering the cost of manufacturing materials and the number of processing steps. Because each successive semiconductor chip is smaller than the underlying semiconductor chip, with the exception of the ultimate semiconductor chip, the problems associated with die attach material squeezing out from under a semiconductor chip and covering a bonding pad on the semiconductor chip are eliminated. What's more, when adhesive films are used rather than a die attach material, the decreasing sizes of the semiconductor chips eliminates problems associated with chip offset, i.e., the difference between the desired positioning of one semiconductor chip on another and the actual position. In addition, the method is readily integrable into multi-chip module processing flows in a cost and time efficient manner.

Although certain preferred embodiments and methods have been disclosed herein, it will be apparent from the foregoing disclosure to those skilled in the art that variations and modifications of such embodiments and methods may be made without departing from the spirit and scope of the invention. For example, the semiconductor chips may be wirebonded to each other as well as the support substrate. Alternatively, an adhesive material may be used to couple the semiconductor chips to the spacer and to each other rather than a die attach material. An advantage of using an adhesive material is that an adhesive material does not have to be cured. It is intended that the invention shall be limited only to the extent required by the appended claims and the rules and principles of applicable law.

What is claimed is:

1. A method for manufacturing a multi-chip module, comprising:
   providing a support substrate having first and second major surfaces, wherein the support substrate has a chip receiving area and a plurality of bonding pads disposed on the first major surface;
   coupling a penultimate semiconductor chip to the chip receiving area, the penultimate semiconductor chip having a plurality of bonding pads;
   coupling an interlevel semiconductor chip between the semiconductor chip receiving area and the penultimate semiconductor chip, wherein the interlevel semiconductor chip is larger than the penultimate semiconductor chip and has a plurality of bonding pads;
   coupling at least one bonding pad of the plurality of bonding pads on the penultimate semiconductor chip to a first bonding pad of the plurality of bonding pads on the first major surface;
   coupling a spacer to a portion of the penultimate semiconductor chip;
   coupling an ultimate semiconductor chip to the spacer after coupling the at least one bonding pad of the plurality of bonding pads of the penultimate semiconductor chip to the at least one bonding pad of the plurality of bonding pads on the first major surface, wherein the ultimate semiconductor chip is larger than the penultimate semiconductor chip and has a plurality of bonding pads; and
   coupling at least one bonding pad of the ultimate semiconductor chip to a second bonding pad of the plurality of bonding pads on the first major surface.

2. The method of claim 1, wherein coupling at least one bonding pad of the plurality of bonding pads on the penultimate semiconductor chip to the first bonding pad of the plurality of bonding pads on the first major surface comprises coupling a first bonding pad on the penultimate semiconductor chip to the first bonding pad on the first major surface.

3. The method of claim 2, wherein coupling the first bonding pad on the penultimate semiconductor chip to the first bonding pad on the first major surface includes wirebonding the first bonding pad on the penultimate semiconductor chip to the first bonding pad on the first major surface.

4. The method of claim 2, wherein coupling at least one bonding pad of the ultimate semiconductor chip to the second bonding pad of the plurality of bonding pads on the first major surface comprises coupling a first bonding pad on the ultimate semiconductor chip to the second bonding pad on the first major surface.

5. The method of claim 4, wherein coupling the first bonding pad on the ultimate semiconductor chip to the second bonding pad on the first major surface includes wirebonding the first bonding pad on the ultimate semiconductor chip to the second bonding pad on the first major surface.

6. The method of claim 1, further including coupling a first bonding pad on the interlevel semiconductor chip to a third bonding pad on the first major surface.

7. The method of claim 6, wherein coupling the first bonding pad on the interlevel semiconductor chip to the third bonding pad on the first major surface includes wirebonding the first bonding pad on the interlevel semiconductor chip to the third bonding pad on the first major surface.

8. The method of claim 7, wherein coupling the interlevel semiconductor chip between the semiconductor chip receiving area and the penultimate semiconductor chip comprises:
   bonding the interlevel semiconductor chip to the chip receiving area; and
   bonding the penultimate semiconductor chip to the interlevel semiconductor chip; and further including
   coupling the first bonding pad on the interlevel semiconductor chip to the first bonding pad on the first major surface before bonding the penultimate semiconductor chip to the interlevel semiconductor chip.

9. The method of claim 7, wherein coupling the interlevel semiconductor chip between the semiconductor chip receiving area and the penultimate semiconductor chip comprises:
   bonding the interlevel semiconductor chip to the chip receiving area; and
   bonding the penultimate semiconductor chip to the interlevel semiconductor chip; and further including
   coupling the first bonding pad on the interlevel semiconductor chip to the first bonding pad on the first major surface after bonding the penultimate semiconductor chip to the interlevel semiconductor chip.

10. The method of claim 1, further including forming a protective structure over the penultimate semiconductor chip and the ultimate semiconductor chip.

11. A method for manufacturing a multi-chip module, comprising:
    providing a support substrate having first and second major surfaces, wherein the support substrate has a chip receiving area and a plurality of bonding pads;
    coupling a first semiconductor chip to the chip receiving area, the first semiconductor chip having a plurality bonding pads;
    coupling a second semiconductor chip to the first semiconductor chip, the second semiconductor chip having a plurality of bonding pads;
    coupling a first bonding pad of the plurality of bonding pads on the first semiconductor chip to a first bonding pad of the plurality of bonding pads on the support substrate;
    coupling a first bonding pad of the plurality of bonding pads on the second semiconductor chip to a second bonding pad of the plurality of bonding pads on the support substrate;
    coupling a third semiconductor chip having a plurality of bonding pads to the second semiconductor chip, wherein the third semiconductor chip is larger than the second semiconductor chip; and
    coupling a first bonding pad of the plurality of bonding pads on the third semiconductor chip to a third bonding pad of the plurality of bonding pads on the support substrate.

12. The method of claim 11, wherein the first semiconductor chip is larger than the second semiconductor chip.

13. The method of claim 11, further including coupling the first bonding pad of the plurality of bonding pads on the first semiconductor chip to the first bonding pad of the plurality of bonding pads on the support substrate before coupling the second semiconductor chip to the first semiconductor chip.

14. The method of claim 11, further including coupling the first bonding pad of the plurality of bonding pads on the first semiconductor chip to the first bonding pad of the plurality of bonding pads on the support substrate after coupling the second semiconductor chip to the first semiconductor chip.

15. The method of claim 11, wherein coupling the first bonding pads of the first second, and third semiconductor chips to the first, second, and third bonding pads of the plurality of bonding pads on the support substrate includes wirebonding the first bonding pads of the first, second, and third semiconductor chips to the first, second, and third bonding pads of the plurality of bonding pads on the support substrate, respectively.

16. The method of claim 11, wherein coupling the third semiconductor chip to the second semiconductor chip includes forming a spacer on the second semiconductor chip and mating the third semiconductor chip with the spacer.

* * * * *